United States Patent [19]

Witherell et al.

[11] Patent Number: 4,805,828
[45] Date of Patent: Feb. 21, 1989

[54] THERMALLY DURABLE SURFACE MOUNTED DEVICE PRINTED WIRING ASSEMBLIES AND APPARATUS AND METHOD FOR MANUFACTURE AND REPAIR

[75] Inventors: Donald R. Witherell; Jay W. Donaldson, both of Cedar Rapids; Howard B. Rooks, Marion, all of Iowa

[73] Assignee: Rockwell International Corporation, El Segundo, Calif.

[21] Appl. No.: 7,076

[22] Filed: Jan. 23, 1987

[51] Int. Cl.⁴ .............................................. B23K 3/02
[52] U.S. Cl. ...................................... 228/46; 219/230; 228/51
[58] Field of Search ............. 228/37, 46, 180.1, 180.2, 228/200, 239, 240, 20 HT, 51; 219/230

[56] References Cited

U.S. PATENT DOCUMENTS

| | | | |
|---|---|---|---|
| 2,068,728 | 1/1937 | Amos | 219/230 X |
| 3,292,240 | 12/1966 | McNutt et al. | 228/180.2 X |
| 3,436,818 | 4/1969 | Merrin et al. | 228/239 X |
| 3,866,307 | 2/1975 | Pfahl et al. | 228/37 X |
| 4,032,033 | 6/1977 | Chu et al. | 228/200 |
| 4,077,467 | 3/1978 | Spigarelli | 228/180.1 X |
| 4,115,601 | 9/1978 | Ammann et al. | 228/180.2 X |
| 4,332,342 | 6/1982 | Van Der Put | 228/200 X |
| 4,361,967 | 12/1982 | Bahnsen et al. | 228/46 X |
| 4,612,712 | 9/1986 | Pescatore et al. | 228/180.1 X |
| 4,679,721 | 7/1987 | Kondo | 228/46 X |

FOREIGN PATENT DOCUMENTS 875398  8/1961  United Kingdom .......... 228/20 HT

OTHER PUBLICATIONS

"Some Fatigue Properties of Solders and Solder Joints" by R. N. Wild, Jan. 1973, IBM Publication #732 Z000421, IBM Federal Systems Division Electronics Systems Center, Owego, N.Y.
"Rapidly Solidified Solder Foil for Die Attachment Application" by K. S. Tan and D. Rose, Apr. 1986, *Solid State Technology*.

*Primary Examiner*—Kenneth J. Ramsey
*Attorney, Agent, or Firm*—Gregory G. Williams; M. Lee Murrah; H. Fredrick Hamann

[57] ABSTRACT

A method and apparatus for manufacture and repair of thermally durable surface mounted device printed wiring assemblies which includes a printed wiring assembly having surface mounted devices thereon, which are attached to said wiring assembly by a quenched or rapidly soldified soldier joint. A method for manufacture and repair of such printed wiring assemblies is to heat the TWAs with SMDs thereon, above the solder melting temperature, and then expose the solder to a fluid below the solder melting temperature which is capable of absorbing heat rapidly from the solder. The intermediate solder joint is thereby rapidly solidified to achieve the advantages of the investive method. The apparatuses disclosed for manufacturing and repairing TWAs include devices capable of heating a solder joint above its melting point, and exposing said solder joint to a fluid having a temperature below the solder melting point, and further capable of absorbing heat rapidly from the molten solder, thereby allowing for a rapid soldification of the solder joint. There is further disclosed apparatuses for exposing the solder joint to a fluid which include sprayers and a liquid bath.

3 Claims, 3 Drawing Sheets

THERMALLY DURABLE SURFACE MOUNTED DEVICE PRINTED WIRING ASSEMBLIES AND APPARATUS AND METHOD FOR MANUFACTURE AND REPAIR

BACKGROUND OF THE INVENTION

The present invention generally relates to printed wiring assemblies (PWAs), and more particularly, is concerned with printed wiring boards (PWBs) of the type having multi-leaded surface mounted devices (SMDs) thereon which are capable of withstanding many temperature cycles.

In today's aviation industry, it is common for a single aircraft to be subjected to several extreme thermal conditions in a relatively short time interval. It is not uncommon for an aircraft to be flying at an altitude of 40,000 feet with an outside temperature of less than −40° F., while only moments earlier it was waiting for a take-off clearance from a hot, humid airport runway. With the current aspirations for trans-atmospheric aircraft, these extreme vicissitudes in the ambient temperature will continue to confront avionics engineers with perplexing problems of increasing difficulty and importance.

One particular problem that is exacerbated by these temperature oscillations is the frequent failure of solder connections between the leads of SMDs and the corresponding pads of PWBs. With such PWAs, temperature swings cause the solder joint between the SMD and the PWB to be subjected to a series of stresses. Typically, the PWBs are of a glass/epoxy laminate or other non-conductive material which has a different coefficient of thermal expansion from the SMDs, which are normally fabricated from ceramic materials. This difference in expansion coefficients results in differing degrees of expansion to occur and the intermediate solder joint to be stressed. This problem is increasingly prevalent in PWAs having large multi-leaded SMDs thereon. Larger SMDs typically have many leads which are very small in comparison to the overall size of the SMD. Furthermore, the lead sizes are not typically changed when the overall size of the SMD is increased; therefore, the ratio of the largest linear dimension of the SMD, which is typically directly related to the stress intensity upon the joint, compared with the lead size, increases whenever the overall size of the SMD increases. Ultimately, the series of differential expansion and contraction places sufficient cumulative stress on the intermediate solder joint to cause both mechanical and electrical failure to occur in large SMDs.

Several alternative connection methods have been used in attempts to extend the number of cycle before failure in temperature cycling. One method has been tried where the SMDs are attached to a PWB or surface similar to conventional PWBs, but in addition, having a heavy metal plate attached to its underside with the SMDs being mounted on the top side. This metal plate is chosen to have a thermal coefficient of expansion which is almost equal to that of the SMDs. This "brute force" approach actually limits the differential expansion that can occur, because the wiring board is physically bound to, and restricted from excess expansion by, the underlying metal plate.

Another method to reduce the thermal cycling problems which has received much attention recently, is to make the connection between the SMDs and the PWBs more flexible, so that the differential expansion can be tolerated. This striving for a move flexible connector has produced several alternative connection techniques. One avenue of though has been to provide a new solder alloy that is much more flexible. This "superflex" solder would permit a differential expansion by having the solder stretch between the SMDs and the PWB. Despite the exhaustive and expensive research performed around the world, a sufficiently flexible solder alloy has not been produced. A second avenue of thought along the lines of increased connection flexibility has been pursued, and currently the method used is to elevate the devices above the PWB with the aid of conductive spring-like connectors, columns or solder, or elongated leads. The extra flexibility is the result of the increased length of the connection.

While these techniques, or variations of them, have been used for reducing solder joint failures in PWAs caused by temperaure cycling, they do have numerous and serious drawbacks. One major problem with the metal plate approach is that the cost and weight of such a board is much more than the typical glass/epoxy PWB. The flexible lead approach also has some serious drawbacks. Problems involving vibrations of the mounted devices occur more frequently when they are elevated. Furthermore, when the devices are elevated the PWB is not as effective as a heatsink. Moreover, the cost of such a design is considerably higher than a typical PWA with SMDs.

Consequently, a need exists for improvement in PWAs having SMDs thereon, and of the type that are subjected to temperature cycling which will result in greater reliability and reduction in cost and weight.

SUMMARY OF THE INVENTION

It is an object of this invention to provide PWAs with SMDs thereon which together are capable of proper functioning after increased numbers of thermal cycles.

It is a feature of this invention to provide a "quenched" solder joint between the PWB and the SMDs.

It is an advantage of this invention to provide a solder joint between the PWBs and the SMDs that have a greatly increased number of temperature cycles before failure.

It is another object of this invention to provide a method for extending the fatigue life for PWBs with SMDs thereon.

It is another feature of this invention to provide an extremely rapid solidification of the solder joint by quenching the joint in a fluid.

It is another advantage of this invention to provide a solder joint that has a smaller crystalline structure when quenched.

It is a further object of this invention to provide an apparatus to solder and thermally treat a PWB having SMDs thereon.

It is a further feature of this invention to provide a solder temperature regulating apparatus having a closed loop single fluid system.

It is a further advantage of this invention to conserve the fluid used in the heating and quenching processes.

It is yet a further advantage of this invention to provide a soldering process that eliminates the exhaustive of potential dangerous gases into the atmosphere.

It is still a further advantage of this invention to conserve the fluid used in the system.

The present invention provides a PWB with SMDs together with methods and apparatuses designed to satisfy the aforementioned objects, containing the above-described features, and producing the previously-stated advantages. The invention embodies a new solder joint and soldering technique that provide a greatly increased time before failure, due to thermal cycling, in solder joints of PWBs having SMDs thereon.

Accordingly, the present invention relates to PWBs of the type having SMDs thereon, and which are exposed to thermal cycling, which comprise a PWB, SMDs, and a quenched solder joint therebetween. The inventive method comprises the step of rapidly solidifying the liquid solder between the PWB and the SMDs. The inventive apparatus was designed to implement the inventive method and produce the inventive PWB assemblies includes a quenching gas, fluid bath or spray apparatus.

DETAILED DESCRIPTION OF PREFERRED EMBODIMENTS

By way of introduction and to lay the background environment for the present invention, FIGS. 1-4 and 6, illustrating several prior art approaches to solving the problem addressed by the present invention, are included.

Figure 1:
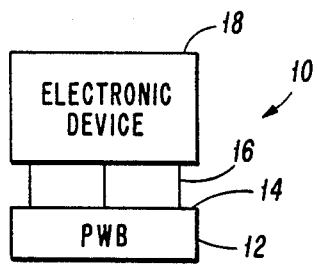
FIG. 1 is a cross-sectional schematic side view of a prior art elongated lead PWA.

Referring now to the drawings, and more particularly to FIG. 1, there is schematically shown an apparatus of the prior art, generally designated 10, which comprises a PWB 12 having a top surface 14 and attached leads 16. An electronic device 18 is elevated above surface 14 and connected thereto by leads 16. These elongated electrical connectors are typically used to increase their flexibility in relation to the typical solder connection for SMDs.

Figure 2:
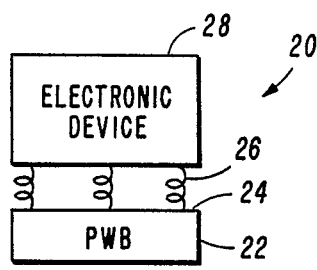
FIG. 2 is a schematic side view of a prior art "spring-like" lead PWA.

Now referring to FIG. 2, there is schematically shown in prior art apparatus, generally designated 20, comprising a PWB 22 having a top surface 24 and a plurality of spring-like connecting leads 26 attached thereto. Elevated above surface 24 and attached thereto by leads 26 is an electronic device 28. These elongated electrical connectors are typically used to increase their flexibility in relation to the typical solder connection for SMDs.

Figure 3:
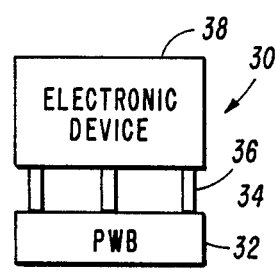
FIG. 3 is a schematic side view of a prior art columns of solder type PWA.

Now referring to FIG. 3, there is shown an apparatus of the prior art, generally designated 30, comprising a PWB 32 having a top surface 34 and a plurality of solder columns 36 attached thereto. Elevated above surface 34 and attached thereto by solder columns 36 is an electronic device 38. These elongated electrical connectors are typically used to increase their flexibility in relation to the typical solder connection for SMDs.

The apparatuses shown in FIGS. 1, 2 and 3 all are known in the art and are designed to provide additional flexibility in the connection between the electronic devices 18, 28 and 38 and the top surfaces 14, 24 and 34, respectively. The added flexibility is achieved by the use of elongated tubes or wires 16, 26, 36 which cause the electronic devices 18, 28 and 38 to be elevated and threeby permits a wider range of motion due to thermal expansion before a lead failure occurs.

Figure 4:
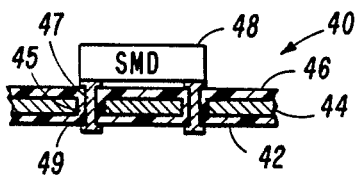
FIG. 4 is a schematic cross-sectional view of a prior art PWA which uses a metal plate to control expansion.

Now referring to FIG. 4, there is schematically shown a prior art apparatus, generally designated 40, which typically comprises a bottom dielectric board 42 which is attached on the underside of a thick metal plate 44. A top dielectric board 46 having SMDs 48 thereon is situated on top of plate 44. Boards 46 and 42 are attached to plate 44, which acts to restrict the expansion of boards 46 and 42. The coefficient of thermal expansion of plate 44 is designed to be nearly equal to the coefficient of thermal expansion for SMD 48, while boards 46 and 42 typically have a larger coefficient of thermal expansion. Plate 44 has channels 45 therethrough which have typically an insulating or dielectric coating 47 which tends to allow an electrode 49 to extend from board 46 through plate 44 and connect with board 42 without electrically connecting with plate 44.

Figure 5:
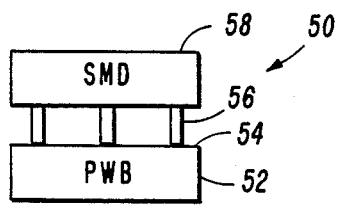
FIG. 5 is a schematic side view of the PWB, SMD and quenched solder joint of the present invention.

Now referring to FIG. 5, there is schematically shown an apparatus of the present invention, generally designated 50, which essentially comprises a PWB 52 or the like having a top edge 54. An SMD 58 is attached to surface 54 by means of quenched solder joints 56. PWB 52, or similar boards, are well known in the art and typically are composed of a dielectric material, or the like, and have a circuit pattern on surface 54. Quenched solder joints 56 are composed of a small crystalline structure alloy with the alloy constituents being in a nearly homogeneous solution. For example, typically when an alloy is heated above its melting point the alloy constituents become a more homogenous solution. Solder joints 56 are a result of rapidly cooling or quenching the solder, which helps to fix the crystalline structure at or near the more homogenous structure. Preferably, the solder used to form solder joints 56, is 63Sn 37Pb, but any appropriate solder may be substituted. The SMD 58 is, typically, an integrated circuit usually having twenty or more contact points by which it is capable of being attached to PWB 52.

Figure 6:
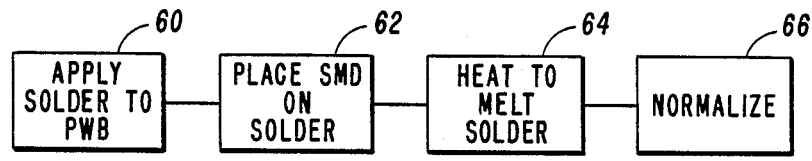
FIG. 6 is a block diagram showing a prior art soldering technique.

Now referring to FIG. 6, there is schematically shown a prior art soldering method which comprises the steps of: applying solder to the PWB, as shown in block 60; placing SMDs on the solder, as shown in block 62, heating the combination of the PWB, the SMDs and the solder joint so that the solder is melted and the soldering process takes place, as shown in block 64; and normalizing, i.e., removing the board, and its attachments, into air at room temperature and allowing them to cool, as shown in block 66.

Figure 7:
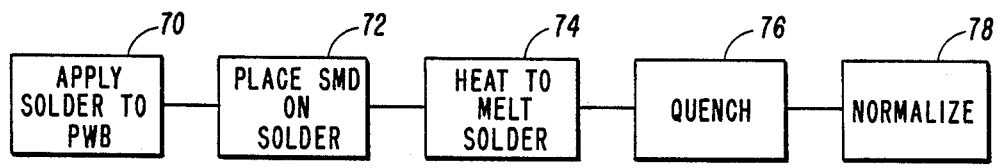
FIG. 7 is a block diagram showing the process of the present invention, which includes the quenching step.

Now referring to FIG. 7, there is schematically shown a method of this invention for solder joint formation comprising the steps of: applying solder to a PWB, as shown in block 70; placing the SMD on the solder, as shown in block 72; heating the combination of the PWB, SMD and solder joint so that the solder is melted and the soldering process takes place, as shown in block 74; immediately thereafter quenching the solder joint or rapidly solidifying the solder joint, as shown in block 76. As shown in block 78, the combination is then allowed to normalize after the solder has solidified.

Quenching can take place in several ways, all of which allow for the rapid solidification of the solder joint. PWB 52, SMD 58 and solder joint 56, in combination, may be immersed in a cold air bath, a cold liquid bath, a warm liquid bath having a high thermal capacity, or any similar bath or fluid which provides for rapid absorption of heat from the solder joint. Another possible method of quenching or rapidly cooling the solder joint is to spray the joint itself with a fluid. Numerous variations or other possible soldering and quenching methods, which provide for the soldering and the rapid solidification of the solder joint, may be utilized, while immersing the PWB 52, SMD 58, and solder joint 56 in reflow oil, which is commonly available, was the preferred method to quench and achieve rapid solidification of the solder joint.

Figure 8:
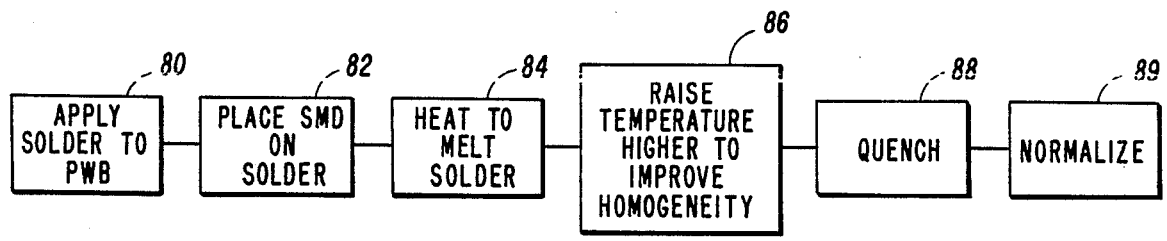
FIG. 8 is a block diagram showing a preferred process of the present invention, which includes the steps of raising the temperature higher and quenching.

Now referring to FIG. 8, there is schematically shown an inventive method which comprises the steps of: applying solder to the PWB, as shown in block 80; placing SMDs on the solder, as shown in block 82; heating the combination of the PWB, SMD and solder joint so that the solder is melted and the soldering process takes place, as shown in block 84; and then further heating the solder to raise the solder temperature in order to make the solder alloy with the mating material interface more homogeneous, as shown in block 86. Immediately thereafter, the solder is rapidly cooled or quenched, as described above and as shown in block 88, and then it is allowed to normalize to room tmperature, as shown in block 89. Numerous variations or other possible soldering and quenching methods, which provide for the soldering and the rapid solidification of the solder joint, may be utilized.

Figure 9:
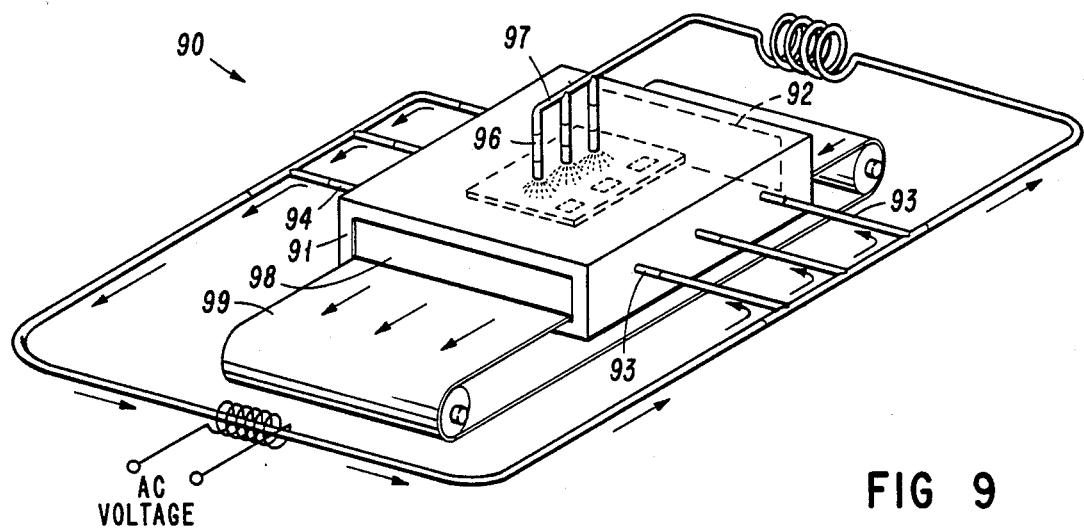
FIG. 9 is a schematic block diagram showing a preferred embodiment of a closed-loop soldering and quenching apparatus of the present invention.

Now referring to FIG. 9, there is schematically shown a soldering apparatus, generally designated 90, for carrying out the invention. Apparatus 90 includes a vapor phase chamber 91, or the like. Vapor phase chambers have long been well known in the art for their use in soldering, and have been constructed of many different designs, all of which utilize the same general principle of melting solder by immersing it in a high temperature vapor. Chamber 91, has a hot vapor provider 93 engaged therein. The hot vapor exits chamber 91 through exhaust vapor ports 94, or the like, into the hot vapor provider 93, which may take numerous designs, so long as the fluid used in the vapor phase soldering process is contained in a closed loop system which provides for a recycling and reheating of the fluid as it passes into the vapor phase chamber through the hot vapor provider 93, then exiting through the exhaust vapor ports 94. Chamber 91 also has quenching spray inlet ports 96, or the like, which attach to a quenching fluid provider 97. The same fluid that is used in the soldering process and contained in the hot vapor provider 93 is diverted into the quenching fluid provider 97 where it is cooled before it is expelled into the chamber 91 through the quenching spray inlet ports 96. The means for reheating, recycling, and cooling the fluid are well-known in the art. Chamber 91 is further provided with a pair of automatic sealing doors 92 and 98 which permit a printed wire assembly to be passed into the chamber 91, be sealed therein, and later exit, with the aid of conveyors 99.

Figure 10:
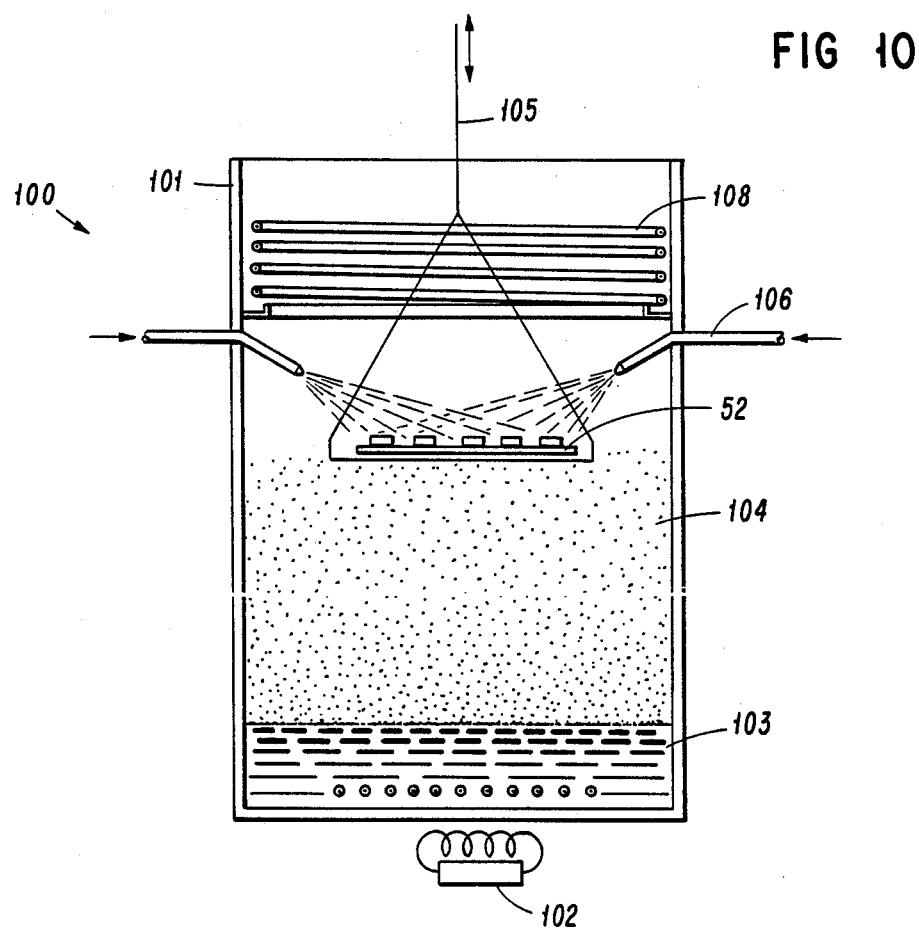
FIG. 10 is a cross-sectional view of a preferred embodiment of a vertical vapor phase soldering and quenching apparatus of the present invention.

Now referring to FIG. 10, there is shown an apparatus, generally designated 100, for carrying out the invention. Apparatus 100 includes a vapor phase chamber 101, or the like, having at its bottom end heater 102 for heating a liquid 103 to its boiling point, which produces a high temperature vapor 104 which rises upwardly through chamber 101. A PWB 52 is lowered through chamber 101 into the high temperature vapor 104 by elevator 105. Chamber 101 has a quenching spray liquid sprayer 106, which provides a quenching spray to be directed upon the PWB 52 when it is retracted from the high temperature vapor 104 by the elevator 105. Chamber 101 further includes a plurality of cooling coils 108 for recondensing the hot temperature vapor to avoid loss of the vapor and fluid.

Figure 11:
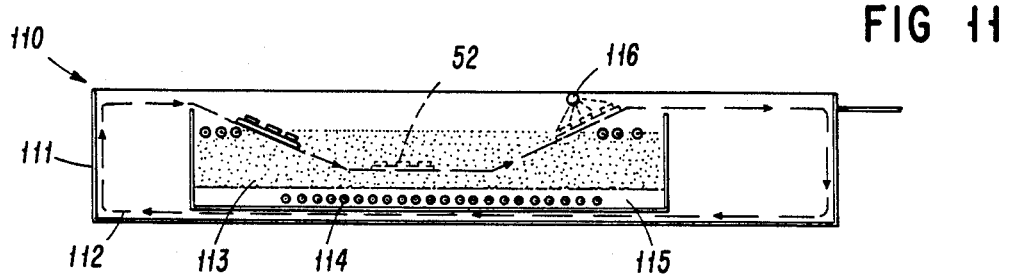
FIG. 11 is a cross-sectional view of an alternate preferred embodiment of a horizontal vapor phase soldering and quenching apparatus of the present invention, which uses a quenching sprayer.

Now referring to FIG. 11, there is schematically shown an apparatus, generally designated 110 which includes a vapor deposition chamber 111, or the like, having a conveyor 112 therein for carrying a PWB 52 through a high temperature vapor 113 which is produced by heating elements 114 located in liquid 115 both of which are located along the bottom of chamber 111. Conveyor 112 transports PWB 52 through and out of high temperature vapor 113. Chamber 111 further includes a quenching spray applicator 116 for spraying a liquid or gas on PWB 52 as it exits high temperature vapor 113.

Figure 12:
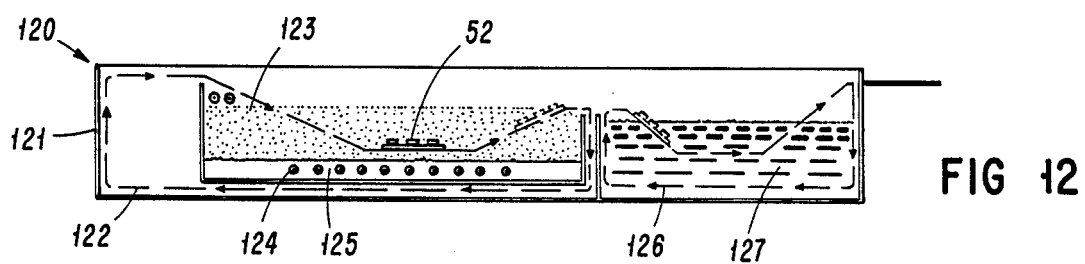
FIG. 12 is a cross-sectional schematic view of yet another preferred embodiment of a horizontal vapor phase soldering and quenching apparatus of the present invention, which uses a liquid quenching bath.

Now referring to FIG. 12, there is schematically shown an apparatus, generally designated 120, which includes a soldering chamber 121, or the like, having a conveyor 122 for transporting a PWB 52 through a high temperature vapor 123 created by heating elements 124 in a liquid 125. Chamber 121 further comprises a high speed conveyor 126 for transporting the PWB 52 from the high temperature vapor 123 to a cooling liquid 127.

Figure 13:
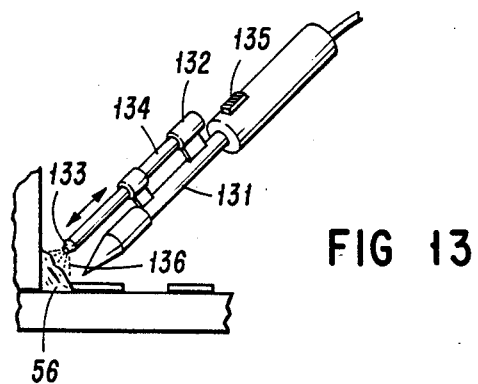
FIG. 13 is a side view of a soldering iron and quenching apparatus of the present invention together with a typical environment.

Now referring to FIG. 13, there is schematically shown an apparatus, generally designated 130, which includes a soldering iron 131, or the like, having an attached cooling apparatus 132 which includes a retractable rapid cooling nozzle 133 which retracts into cylinder 134. Nozzle 133 is selectively controlled by an attached control switch 135. A spray 136 is selectively discharged from nozzle 133 onto solder joint 56.

Figure 14:
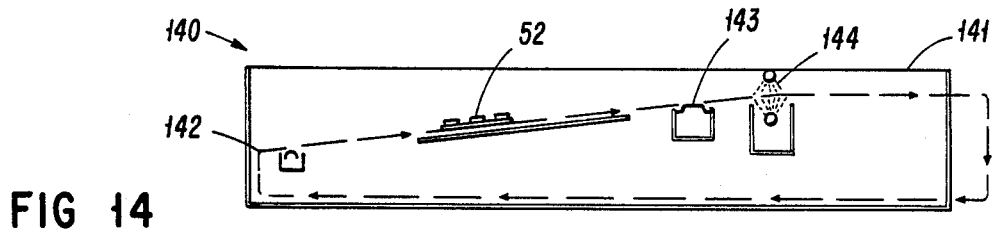
FIG. 14 is a cross-sectional view of a solder wave and quenching apparatus of the present invention.

Referring now to FIG. 14, there is schematically shown an apparatus, generally designed 140, which includes a soldering chamber 141, or the like, having a conveyor 142 for transporting a PWB 52 by a solder wave 143 and a quenching sprayer 144 included in chamber 141, in a position as near as possible to the solder wave 143 so that the solder is not solidified before quenching occurs.

Figure 15:
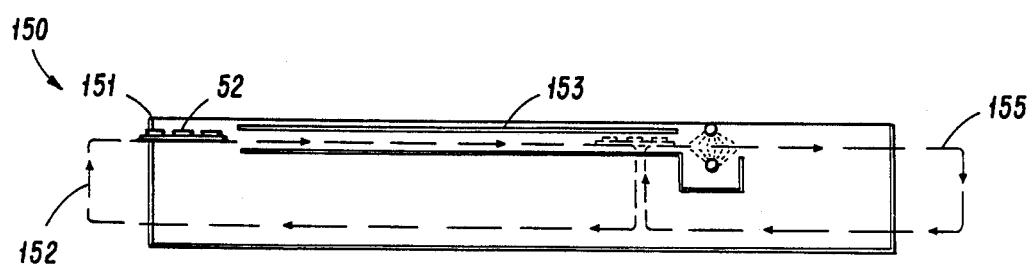
FIG. 15 is a cross-sectional view of a preferred embodiment of an infrared soldering and quenching apparatus of the present invention.

Referring now to FIG. 15, there is schematically shown an apparatus, generally designated 150, which includes an infrared soldering chamber 151 having a conveyor 152 for transporting a PWB 52 through an infrared heating element 153, and then it passed to the high speed conveyor 155, and continues on to a quenching sprayer 154, which is located in a position as near as possible to the infrared heat sources so that the solder is not solidified before quenching occurs.

OPERATION

In operation, the PWB 52 of FIG. 5 was caused to be physically and electrically connected to the SMD 58 by melting solder joints 56, which contacted both the PWB 52 and SMD 58. The solder joints were typically melted by exposed them to a high temperature heat source such as; a high temperature vapor, as shown in FIGS. 9, 10, 11, 12, a soldering iron similar to FIG. 13; a solder wave of FIG. 14; or or an infrared heating element as shown in FIG. 15. Irrespective of the method used to melt the solder, a rapid solidification of the solder joints 56 was achieved by exposing the molten solder to a vapor phase soldering fluid or reflow oil having a temperature below the solidification point of the particular solder used and further having a high capacity for absorbing thermal energy from the solder. Preferably, the solder was sufficiently warm for a sufficient time so as to allow for the complete melting of the solder.

TEST RESULTS

Rapidly solidifying the completely molten solder has proven to greatly enhance the thermal cycling characteristics of the PWB with SMDs thereon. A limited test of the PWBs of this invention has been conducted under the following conditions and with the following results.

Four PWAs were involved in this test. Each board contained several 32-leaded devices thereon. Furthermore, each board was vapor phase soldered; the solder was allowed to normalize and thereby slowly solidify by removing the PWAs into air at room temperature. Board 1 can be viewed as the control board and was not quenched. Board 2 was reheated in reflow oil to 400° F. and immediately quenched by immersion in cool reflow oil. Board 3 was reheated in reflow oil to 450° F. and quenched as above. Board 4 was reheated in reflow oil to 480° F. and quenched as above. Boards 2, 3 and 4 were washed in hot water to remove the reflow oil and then were subjected to temperature cycling tests. The following temperature shock tests were performed on each of the four boards, with SMD devices thereon. One typical temperature cycle extended over the range of −55° C. to ±125° C. The boards were subjected to these shock tests at the rate of one cycle per hour. The number of cycles before inspection of the boards was set at 50 or 25 cycles before inspection. The following Table 1 displays the number of lead failures for each part on the boards tested after each interval of inspection.

TABLE 1

| | | Number of Failures CYCLES | | | | | | |
|---|---|---|---|---|---|---|---|---|
| | | 50 | 75 | 100 | 150 | 200 | 225 | 250 |
| PROD. | 41 | 0 | 0 | 0 | 1 | 12 | 13 | 16 |
| | 42 | 0 | 1 | 10 | 10 | 12 | 13 | 16 |
| | 43 | 0 | 0 | 1 | 7 | 15 | 16 | 18 |
| 400° F. | 44 | 0 | 0 | 0 | 0 | 0 | 0 | 0 |
| | 45 | 0 | 0 | 0 | 0 | 0 | 0 | 0 |
| | 46 | 0 | 0 | 0 | 0 | 0 | 0 | 2 |
| | 47 | 0 | 0 | 0 | 0 | 0 | 0 | 0 |
| 450° F. | 48 | 0 | 0 | 0 | 0 | 0 | 0 | 3 |
| | 49 | 0 | 0 | 0 | 0 | 0 | 0 | 2 |
| | 50 | 0 | 0 | 0 | 0 | 0 | 0 | 1 |
| | 51 | 0 | 0 | 0 | 0 | 0 | 0 | 0 |
| 480° F. | 412 | 0 | 0 | 0 | 0 | 0 | 0 | 2 |
| | 413 | 0 | 0 | 0 | 0 | 0 | 0 | 4 |
| | 414 | 0 | 0 | 0 | 0 | 0 | 0 | 0 |
| | 415 | 0 | 0 | 0 | 2 | 7 | 8 | 11 |

The mean cycles before first failure of a lead in one of the three parts tested in the control group, which normalized the solder after soldering, was approximately between 75 and 100 cycles. The test was conducted in intervals having 25 cycles or 50 cycles per interval of inspection of results. Assuming arguendo, that the failures in the control group occurred at the last cycle of the interval before inspection, and further assuming that the first failure of a part prepared by the invention process, which was quenched after being heated to 400° F., occurred at the first cycle of the interval between the 225 and the 250 cycles, then it becomes apparent that an increase of cycle life of at least 125% occurred, between the mean cycles before first failure of the control group of approximately 100 cycles, and the absolute first failure of the inventive group at 225 cycles. This claim of 125% increase in cycle life is a conservative claim considering that the control group was judged by the mean cycles before the first part failure, while assuming, arguendo, that the part failed at the lastest possible momoent, and in comparison the quenched 400° F. part was judged by its absolute first failure, not its mean first failure, and moreover the failure was assumed, arguendo, to occur at the earlier possible cycle of the interval.

It is thought that the PWBs with SMDs thereon of the present invention together with the apparatus and methods for producing such PWBs and many of their attendant advantages will be understood from the foregoing description, and it will be apparent that various changes may be made in the form, construction and arrangement of the parts and steps thereof without departing from the spirit and scope of the invention, or sacrificing all of their material advantages, the form hereinbefore described being merely preferred or exemplary embodiments thereof.

We claim:

1. An apparatus for melting a solder joint, comprising:
   a. a soldering iron having a handle and a soldering tip for heating a solder joint; and
   b. a quenching fluid sprayer means attached to the soldering iron and extending toward the soldering tip.

2. An apparatus as in claim 1 wherein said quenching fluid sprayer means further comprises a cylinder attached to the soldering iron and extending from the handle toward the soldering tip.

3. An apparatus as in claim 2 wherein said cylinder further comprises a retractable cylinder being capable of translational motion toward or away from said soldering tip.

* * * * *